United States Patent
Takahashi

(10) Patent No.: US 7,583,460 B2
(45) Date of Patent: Sep. 1, 2009

(54) EDGE CONTROLLED FAST DATA PATTERN GENERATOR

(75) Inventor: Hisao Takahashi, Kanagawa (JP)

(73) Assignee: Tektronix International Sales GmbH, Rheinfall (CH)

( * ) Notice: Subject to any disclaimer, the term of this patent is extended or adjusted under 35 U.S.C. 154(b) by 377 days.

(21) Appl. No.: 11/439,405

(22) Filed: May 22, 2006

(65) Prior Publication Data

US 2006/0267650 A1 Nov. 30, 2006

(30) Foreign Application Priority Data

May 27, 2005 (JP) ............................. 2005-156464

(51) Int. Cl.
*G11B 5/09* (2006.01)
(52) U.S. Cl. ................. 360/51; 360/48; 360/77.02; 327/170
(58) Field of Classification Search ................. None
See application file for complete search history.

(56) References Cited

U.S. PATENT DOCUMENTS

| | | | | |
|---|---|---|---|---|
| 4,559,568 A | * | 12/1985 | Watanabe et al. | 360/48 |
| 4,604,756 A | * | 8/1986 | Moustakas et al. | 375/364 |
| 5,028,824 A | * | 7/1991 | Young | 327/262 |
| 5,124,669 A | * | 6/1992 | Palmer et al. | 331/1 A |
| 5,389,828 A | * | 2/1995 | Tago | 327/263 |
| 5,638,070 A | * | 6/1997 | Kuwaoka | 341/95 |
| 5,878,097 A | * | 3/1999 | Hase et al. | 375/371 |
| 6,087,868 A | * | 7/2000 | Millar | 327/156 |
| 6,390,579 B1 | * | 5/2002 | Roylance et al. | 347/9 |
| 6,438,081 B2 | * | 8/2002 | Jinbo et al. | 369/47.28 |
| 6,448,824 B1 | * | 9/2002 | Rodriguez et al. | 327/74 |
| 6,463,092 B1 | * | 10/2002 | Kim et al. | 375/219 |
| 6,586,924 B1 | * | 7/2003 | Okayasu et al. | 324/158.1 |
| 6,628,157 B1 | * | 9/2003 | Kuppuswamy et al. | 327/276 |
| 6,721,114 B1 | * | 4/2004 | Sutardja et al. | 360/45 |
| 6,731,144 B2 | * | 5/2004 | Endo | 327/151 |
| 6,741,668 B1 | * | 5/2004 | Nakamura | 375/376 |
| 7,171,601 B2 | * | 1/2007 | Frisch | 714/738 |
| 2004/0135606 A1 | * | 7/2004 | Takahashi et al. | 327/170 |
| 2005/0002120 A1 | * | 1/2005 | Chainer et al. | 360/51 |
| 2005/0060600 A1 | * | 3/2005 | Jeddeloh | 714/5 |
| 2005/0213696 A1 | * | 9/2005 | Totsuka et al. | 375/376 |

* cited by examiner

*Primary Examiner*—Hoa T Nguyen
*Assistant Examiner*—Dismery E Mercedes
(74) *Attorney, Agent, or Firm*—William K. Bucher

(57) ABSTRACT

Fast data patterns with desired edge positions are provided. A pattern generator (PG) circuit 10 stores and provides data patterns and respective position control data. A delay circuit 16 delays a clock CLK to produce a position control clock according to the position control data. An output flip flop 18 provides the data patterns following to the position control clock. The position of the clock is controlled as an operation reference of the data pattern and, as a result, controls the edge positions of the output data pattern.

5 Claims, 3 Drawing Sheets

EDGE CONTROLLED FAST DATA PATTERN GENERATOR

BACKGROUND OF THE INVENTION

The present invention relates generally to data pattern generators and more particularly to a data pattern generator that can shift edge positions of the output data pattern as desired.

In developing an electronic circuit, a trial circuit is made wherein a preceding block of the circuit may not be finished. A signal generator may simulate the preceding block to provide signals that the preceding block would output if it was completed.

Digital circuit processes are not always ideal resulting in the shifting of the rising and falling edges in a data pattern of a pulse train from the ideal positions, which appears as jitter of the rising and falling edges. A jitter tolerance is usually specified for digital circuits so that the circuit works well even if there rising and falling edges of the input pulse train has jitter.

To confirm the circuit under development meets specified jitter tolerances, a data pattern having jitter is provided to the digital circuit to confirm the operation of the circuit. According to this need, there is a data pattern generator that can provide data patterns in which the rising and falling edges are shifted relative to the ideal positions as specified by a user.

U.S. Pat. No. 5,389,828 by Tago discloses a pulse width adjusting circuit that shifts rising or falling edge positions of pulses in an input pulse train. Referring to FIG. 1, a comparator 4 compares an input pulse to an output of a digital to analog converter (DAC) 2 to shift the rising and falling edge positions of the input pulse. The variable time delay of the rising and falling edges of the output pulse of the comparator 4 is a function of the input control signal to the DAC 2. A delay circuit 6 also receives the input pulse and applies a time delay to the input pulse. A logic circuit 8 receives the time delayed input pulse from the delay circuit 6 and the output pulse of the comparator 4 and shifts the rising edge position of the output pulse from the comparator 4 as a function of the control signal to the DAC 2 and the falling edge position as a function of the delay circuit 6.

As described, the pulse width adjustable circuit disclosed in U.S. Pat. No. 5,389,828 independently controls trailing edge of the delayed pulse with respect to the leading edge using the delay circuit 6. There are various types of delay circuits but, at the present, the load time for delay circuits is to slow to allow the setting of the leading or trailing edges of a gigahertz pulse trail in real time.

US publication No. 2004/0135606 discloses an invention to overcome the shortcoming of the long setting time of the delay circuit. The invention has two delay blocks with one block delays an input pulse train while the other block changes the setting of the delay time. But this circuit requires the detection of an edge position of the input pulse train so as not to break a pulse when the circuit switches blocks because the input pulse train is asynchronous with the system clock of the circuit. This operation makes it impossible to change the edge positions of the respective pulses in real time.

SUMMARY OF THE INVENTION

The present invention is directed to a data pattern generator that can change edge positions of the data pattern pulse by pulse. The data change positions (e.g. "from 0 to 1" or "from 1 to 0" of the data pattern) are called edge positions hereinafter. A data providing means stores and provides data patterns and respective position control data. A delay means delays a system clock of the data pattern generator according to the position control data to provide a position control clock corresponding to the position control data. A data output control means outputs the data pattern according to the position control clock. The position of the clock is controlled as an operation reference of the data pattern and, as a result, controls the edge positions of the output data pattern. A user may insert jitter into the output data pattern by changing the delay amounts the output data pattern. The present invention may be used to cancel the jitter in the output data pattern by adjusting the delay amounts in the direction to reduce the jitter.

To enable the delay means to respond to faster data patterns, means for alternately providing position control data to a plurality of the delay means are provided where the delay means are a natural number k. The delay means receive the clock with the plurality of delay means providing a plurality of delayed clocks to a combining means to produce the position control clock. The delay means may be a programmable delay device and requires a given time from the receipt of the position control data through the start of the clock delay operation but the sequential use of k delay means enable to use higher frequency of the clock.

The objects, advantages and other novel features of the present invention are apparent from the following detailed description when read in conjunction with the appended claims and attached drawings.

DETAILED DESCRIPTION OF THE INVENTION

Figure 1:
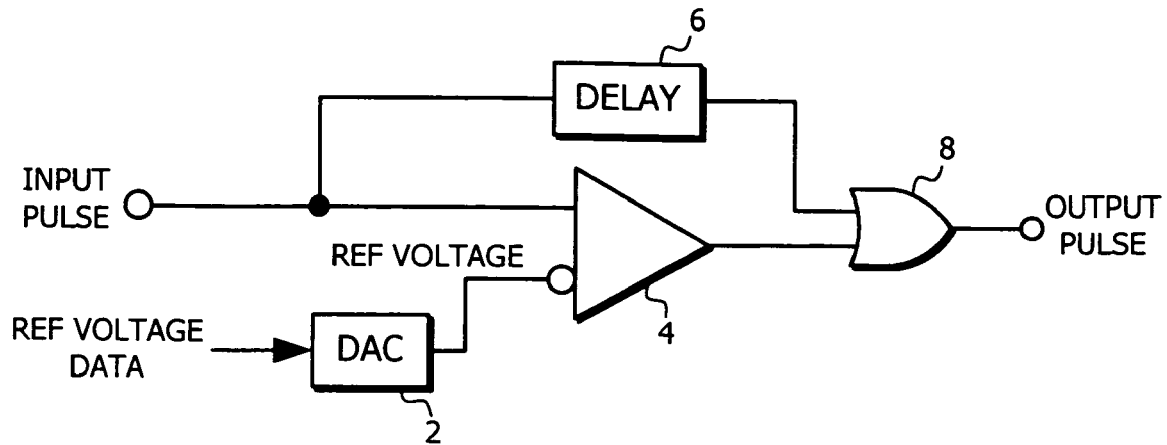
FIG. 1 is an example of a block diagram of a conventional circuit for controlling rising or falling edge position.
Figure 2:
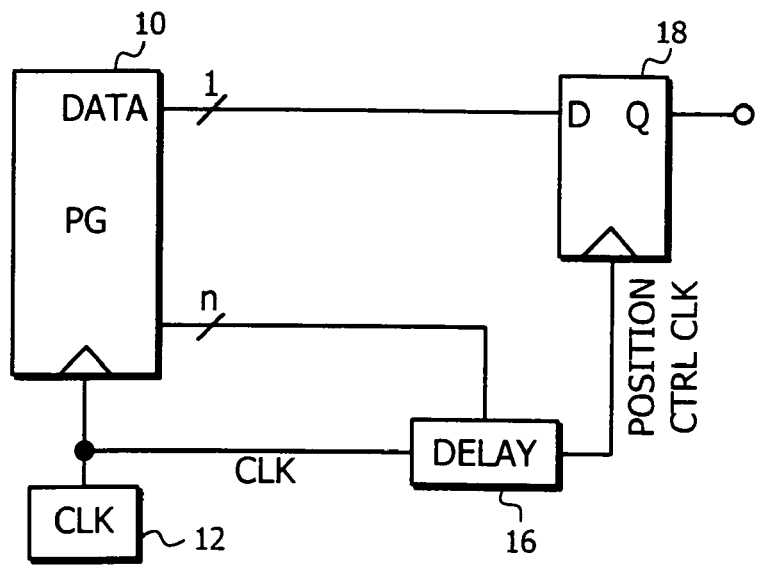
FIG. 2 is an example of a block diagram of the first embodiment according to the present invention.
Figure 3:
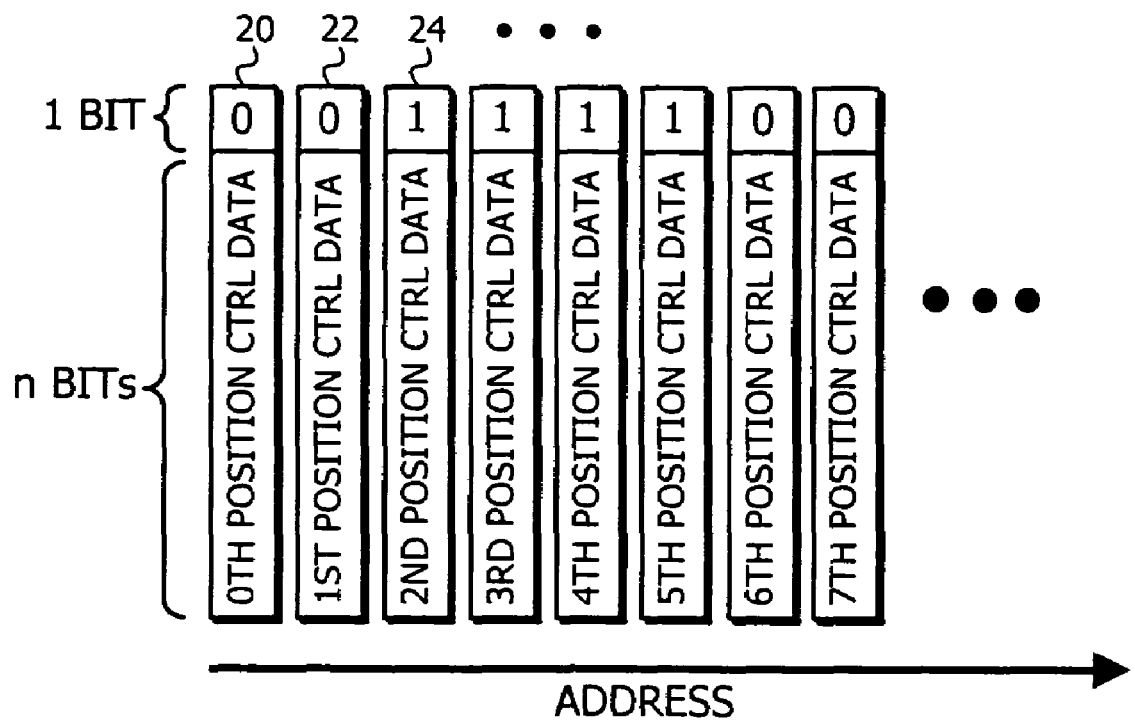
FIG. 3 is an example of a schematic diagram of data stored in a memory according to the present invention.

FIG. 2 is a functional block diagram of a first embodiment according to the present invention. A pattern generator (PG) circuit 10 receives a system clock CLK from a clock oscillator 12 and outputs data each of which includes a one-bit data pattern and a n-bit edge position control data that indicate how long of a delay the corresponding rising and/or falling edges as shown in FIG. 3. The data may be prepared for storage in a memory like a hard disk drive, RAM, etc. associated with the PG circuit 10 by editing a displayed waveform or directly entering numeric values for the waveform.

A delay circuit 16 receives the position control data along with the clock CLK and provides a delayed position control clock to an output flip flop (FF) 18. The delay circuit may be a programmable delay circuit that changes the delay of an input signal (CLK in this case) according to the n-bit position control data.

The output FF 18 also receives the one-bit data patterns from the PG circuit 10 and provides a data pattern from the Q terminal according to the position control clock. As a result, the position control data controls the edge positions of the corresponding data pattern.

Referring to FIG. 3 again, each of the bars corresponds to the content at one data address of the PG circuit 10 memory, and indicates examples of the data stored at each address. For example, a data pattern "0" and the corresponding 0th position control data are written at 0th address 20. The first delay amount of the delay circuit 16 is the 0th position control data. At the next address 22, a data pattern "0" and the corresponding 1st position control data are written. At the following address 24, a data pattern "1" and the corresponding 2nd position control data are written so that the data pattern "1" is provided from the output FF 18 following the position control clock which is produced according to the 2nd position control data. The following processes are similar to the above.

If consecutive data patterns are the same, the output data pattern does not change even if the respective position control data are different since the patterns are the same. However, if a data pattern is different from the preceding one, the edge position of the output data pattern is changed. Then the position control data may be written only at addresses that store data patterns different from the preceding ones.

Figure 4:
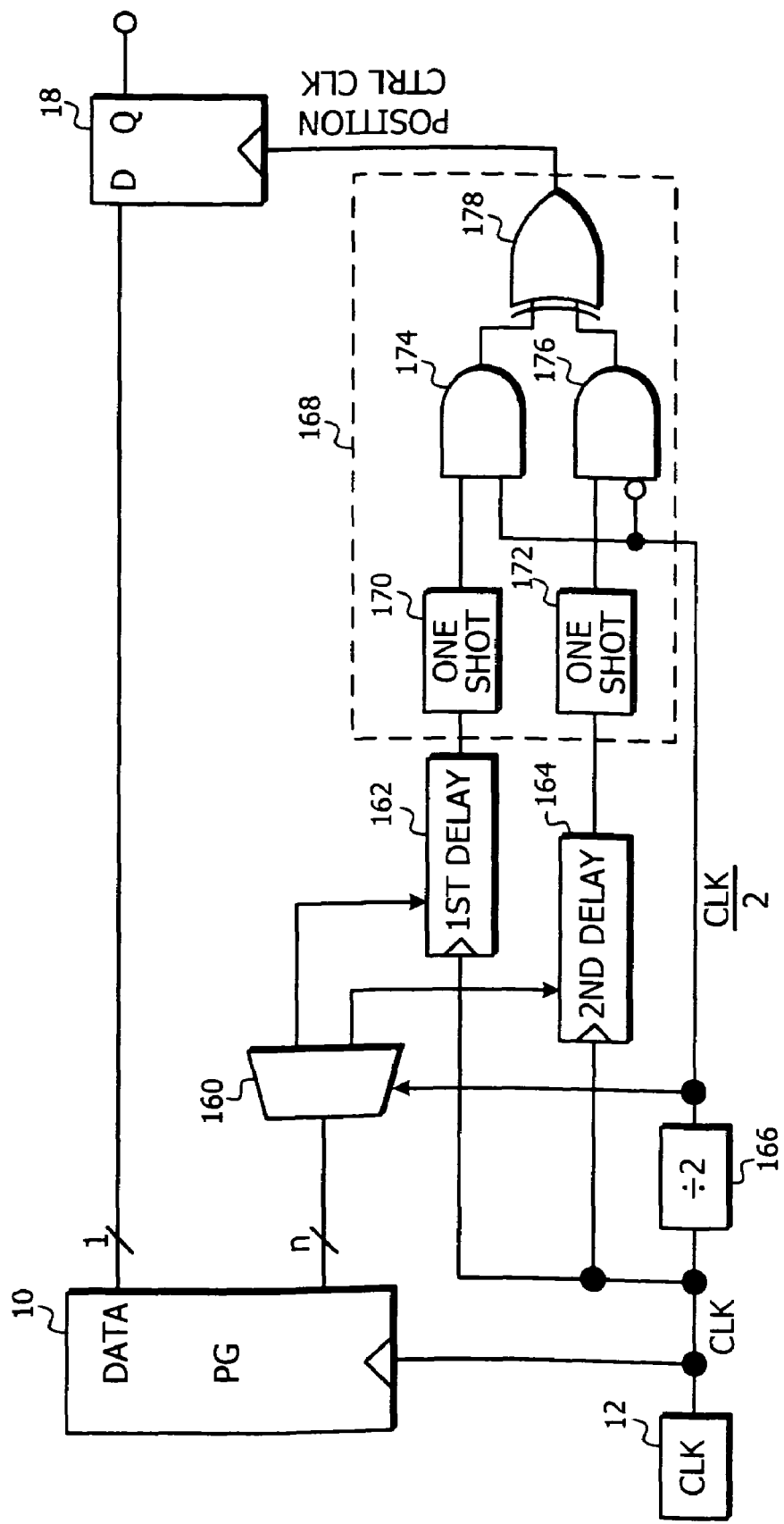
FIG. 4 is an example of a block diagram of the second embodiment according to the present invention.

FIG. 4 is a functional block diagram of the second embodiment according to the present invention. In the following descriptions, corresponding blocks from the previous figures are indicated by the same numbers. If the PG circuit 10 outputs data patterns at a high rate, data writing into the delay circuit may not be complete within one clock. The second embodiment is suitable for such a case and enables edge control of a faster data pattern than that of the first embodiment.

A divider 166 produces a divided clock CLK/2 derived by dividing the clock CLK by two. The n-bit position control data is alternatively provided to first and second delay circuits 162 and 164 via a demultiplexer 160 receiving the divided clock CLK/2. A combiner 168 alternatively combines the first and second position control clocks from the respective delay circuits 162 and 164 according to the divided clock CLK/2 to provide the combined clock to the output FF 18.

In the example of FIG. 4, the combiner 168 includes one-shot pulse circuits 170 and 172 that receive the first and second position control clocks. The one-shot pulse circuits 170 and 172 narrow the pulse widths of the first and second position control clocks to prevent an error caused by a large delay amount being set to a delay circuit and the output being kept at "1" in spite of the next divided clock coming. The first and second position control clocks are coupled to respectively gates 174 and 176 that also receive the divided clock CLK/2. The first and second control clocks alternatively pass the two gates 174 and 176 following the divided clock CLK/2 and are combined using an exclusive OR gate 178. This embodiment shows an example of using two delay circuits but any number of delay circuits k (where k is a natural number) may also be used wherein the dividing ratio of the divider 166 is also k.

As described, the present invention relates data patterns and position control data to control delay amounts pulse by pulse (or data by data). A user may insert jitter into the output data pattern by changing the delay amounts the output data pattern. The data pattern generator circuit sometimes may provide data patterns with undesirable jitter even though the ideal data pattern generator should provide data pattern without jitter. The present invention may be used to cancel the jitter in the output data pattern by adjusting the delay amounts in the direction to reduce the jitter.

What is claimed is:

1. A data pattern generating method comprising the steps of:
   generating a divided clock signal from the clock signal;
   generating data pattern bits and corresponding position control data in response to the clock signal;
   providing the data pattern bits to an output circuit;
   providing the clock signal to first and second delay circuits;
   alternately providing the corresponding position control data for each data pattern bit to the first and second delay circuits in response to the divided clock signal;
   delaying the clock signals provided to the first and second delay circuits according to the respective position control data provided to the first and second delay circuits to produce respective alternating position control clocks;
   combining the position control clocks from each of the first and second delay circuits to produce a combined position control clock received by the output circuit according to the alternating position control data; and
   generating data patterns bits having at least one of a leading edge and a trailing edge position controlled according to the combined position control clock.

2. The data pattern generating method as recited in claim 1 further comprising the step of delaying the clock signals using respective programmable delay circuits.

3. A data pattern generator comprising:
   a pattern generator outputting data pattern bits and corresponding position control data in response to a clock signal;
   a divider circuit receiving the clock signal and generating a divided clock signal;
   a demultiplexer receiving the position control data from the pattern generator and the divided clock signal and alternately outputting the position control data to first and second delay circuits in response to the divided clock;
   the first and second delay circuits receiving the clock signal with the first and second delay circuits each generating a position control clock according to the position control data received from the demultiplexer;
   a combining circuit receiving the respective position control clocks from each of the first and second delay circuits and the divided clock and generating a combined position control clock; and
   an output circuit receiving the data pattern bits and the combined position control clock and generating data pattern bits having at least one of a leading edge and a trailing edge position controlled according to the combined position control clock.

4. The data pattern generator as recited in claim 3 wherein the first and second delay circuits comprise programmable delay circuits.

5. The data pattern generator recited in claim 3 wherein the combining circuit further comprises:
   first and second one shot pulse circuits wherein the first one shot pulse circuit receives the position control clock from the first delay circuit and the second one shot pulse circuit receives the position control clock from the second delay circuit, with the first and second one shot pulse circuits narrowing the pulse widths of the respective position control clocks;
   first and second AND gates with the first AND gate receiving the narrowed pulse width position control clock from the first delay circuit and the divided clock, and the second AND gate receiving the narrowed pulse width position control clock from the second delay circuit and an inverted divided clock, with the first AND gate generating a logical output in response to the divided clock and the narrowed pulse width position control clock from the first delay circuit and the second AND gate generating a logical output in response to the inverted divided clock and the narrowed pulse width position control clock from the second delay circuit; and
   an exclusive OR gate receiving the logical outputs from the first and second AND gates and generating the combined position control clock according to the alternating position control data.

* * * * *